United States Patent [19]

De Jong et al.

[11] Patent Number: 6,119,256
[45] Date of Patent: Sep. 12, 2000

[54] APPARATUS FOR TESTING A FIXED LOGIC VALUE INTERCONNECTION BETWEEN INTEGRATED CIRCUITS

[75] Inventors: Franciscus G. M. De Jong; Mathias N. M. Muris, both of Eindhoven, Netherlands

[73] Assignee: U.S. Philips Corporation, New York, N.Y.

[21] Appl. No.: 08/356,946

[22] Filed: Dec. 15, 1994

[30] Foreign Application Priority Data

Dec. 16, 1993 [EP] European Pat. Off. ............... 93203547

[51] Int. Cl.$^7$ ..................................................... G01R 31/28
[52] U.S. Cl. ............................................... 714/726; 714/30
[58] Field of Search ................................. 371/22.3, 22.1, 371/22.5, 22.2, 25.1; 324/158.1, 73.1; 714/5, 8, 25, 26, 30, 32, 43, 726, 729, 733, 735; 365/201

[56] References Cited

U.S. PATENT DOCUMENTS

| | | | |
|---|---|---|---|
| 4,879,717 | 11/1989 | Sauerwald et al. ..................... | 371/22.3 |
| 4,967,142 | 10/1990 | Sauerwald et al. ..................... | 324/73.1 |
| 5,029,166 | 7/1991 | Jarwala et al. .......................... | 371/22.1 |
| 5,384,533 | 1/1995 | Tokuda et al. ......................... | 324/158.1 |
| 5,390,191 | 2/1995 | Shiono et al. .......................... | 371/22.3 |
| 5,487,074 | 1/1996 | Sullivan ................................. | 371/22.3 |

OTHER PUBLICATIONS

"Boundary–Scan Test: A Practical Approach", by H. Bleeker et al, pp. 1–17.
"256 X 8–bit Static CMOS EEPROM With I$^2$ C Bus Interface", Data Development, Oct. 1987, pp. 535–539.

*Primary Examiner*—Nadeem Iqbal
*Attorney, Agent, or Firm*—Anne Barschall

[57] ABSTRACT

A device which includes a first integrated circuit and a second IC for applying a fixed logic value to an input of the first integrated circuit. A conventional implementation uses pull-up and pull-down resistors, but these resistors necessitate an additional step and additional elements for the testing of the relevant interconnections. The device is improved in that an output of the second IC, which outputs the logic value during normal operation, is controlled via test logic during testing. As a result, the interconnections between the output of the second IC and the input of the first IC are tested in the same way and as part of the testing of the other interconnections between the first and second integrated circuits.

17 Claims, 4 Drawing Sheets

APPARATUS FOR TESTING A FIXED LOGIC VALUE INTERCONNECTION BETWEEN INTEGRATED CIRCUITS

BACKGROUND OF THE INVENTION

This invention relates to a device comprising: an electronic circuit with a first test connection, a means with an output for supplying a signal input of the electronic circuit with a fixed logic value in an operational mode, and an electric interconnection between the output and the signal input. A known example of such a means is a pull-up resistor for applying a logic "1" as a fixed value to a non-used input of an IC.

Inputs which are to receive a fixed value in logic circuits are usually provided with so-called pull-up or pull-down resistors. A resistor of this kind is connected to the relevant input on the one side and to a fixed voltage on the other side. Leaving inputs open is not permissible, inter alia because oscillations which are liable to damage the IC may then arise. Direct connection of the relevant input to a fixed voltage usually is not permitted. From the point of view of testability, a special test point on the conductor and a resistor are often prescribed.

Logic circuits utilize integrated circuits (ICs) which increasingly comprise Boundary Scan Test (BST) logic. These ICs enable the testing of the interconnection function of the circuit support in conformity with the BST method. See pages 1 to 17 of the book "Boundary-Scan Test, A Practical Approach", Harry Bleeker, Peter van den Eijnden and Frans de Jong, Kluwer Academic Publishers, Boston, US, 1993, ISBN 0-7923-9296-5 for a description of the testing according to the BST method.

In order to enable complete testing of an interconnection, all connection points should be connected to ICs provided with BST logic or other logic capable of generating or analysing test data. This implies that the interconnection between the above-mentioned input to a pull-up or pull-down resistor cannot be tested by way of the BST method because resistors do not comprise test logic.

SUMMARY OF THE INVENTION

It is, inter alia, an object of the invention to test the interconnections to the inputs supplied with a fixed logic value in a simple manner which is more compatible with the testing of the other interconnections. To this end, according to one of the aspects of the invention there is provided a means with an output for supplying relevant inputs with a fixed logic value in an operational mode, characterized in that the means comprises a second test connection and that the circuit and the means are arranged to enter a test mode, under the control of predetermined signals on the respective test connections, in order to test the interconnection in a cycle comprising: (1) setting the means and the circuit to the test mode, (2) supplying the second test connection with and transferring, via said output, test data to the interconnection as an alternative to the fixed logic value, and (3) receiving result data in the circuit, via the signal input and transferring result data to the first test connection for verification. Further advantages of the invention reside in a saving in respect of components and in more freedom in designing the interconnections to the inputs.

In a first embodiment, the interconnection is tested in accordance with the BST method as described in the BST standard (IEEE Std. 1149.1-1990).

The invention also relates to a means as described above which is accommodated in a special-purpose IC in a second embodiment.

In another embodiment, the means is implemented as a part of an existing IC, the relevant fixed logic value becoming available via a pin which possibly did not have a function previously (for example, a Not Connected pin).

BRIEF DESCRIPTION OF THE DRAWINGS

The invention will be described in detail hereinafter with reference to a preferred embodiment and the accompanying drawings, in which.

DESCRIPTION OF THE PREFERRED EMBODIMENTS

Figure 1:
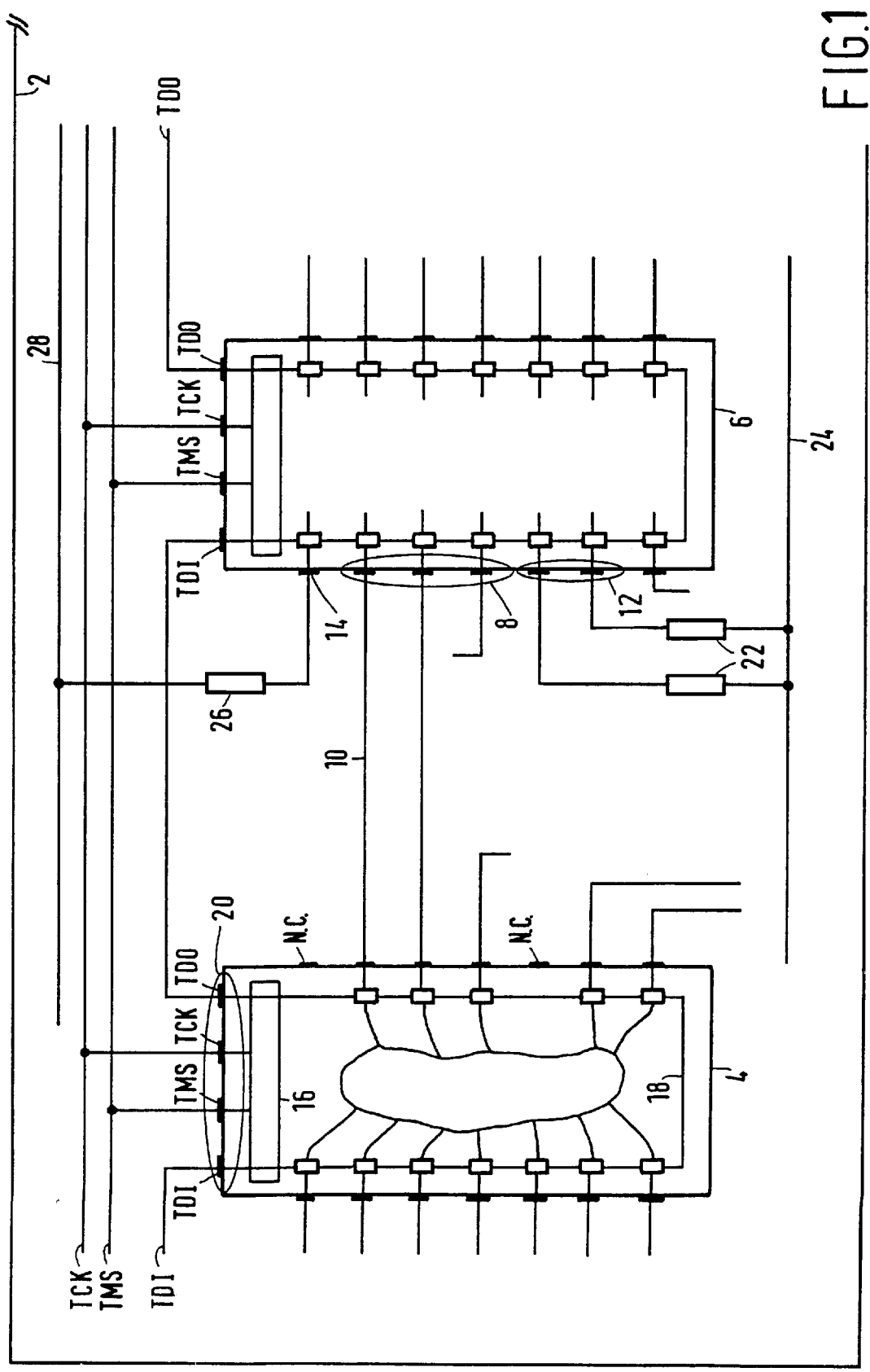
FIG. 1 shows a circuit with conventional pull-up and pull-down resistors for obtaining the fixed logic values.

FIG. 1 shows a part of a support (2) on which there are provided two ICs (4 and 6) which comprise at least partly digital logic. The function of the ICs is not relevant to the invention and will not be described. A group of input pins (8) of the IC (6) are functionally connected to various points in the circuit. In the Figure an interconnection is diagrammatically represented by a line, for example the line (10), and is usually implemented in the form of a conductor pattern on the support. There are also a number of input pins (12 and 14) of the IC (6) which require a fixed value in the present circuit. An example of such a situation is the application of a part of a fixed address via a number of pins such as the pins A0, A1 and A2 of the IC PCF8582 manufactured by Philips Semiconductors.

The ICs (4) and (6) are arranged to be tested according to the BST method. To this end, they comprise a TAP controller and further means, symbolized by the block (16), for controlling the test and for applying the test data to the correct locations via a chain (18) of BST cells which contain a value for each pin, and a number of BST pins (20) for receiving, and if necessary for passing on, test data and test control data. The input pins (12) are connected to ground (24) via resistors (22), so that they carry a logic value "0". The input pin (14) is connected, via a resistor (26), to the supply voltage (28) and hence carries a logic value "1".

The interconnection function of the support (2) will be tested partly in conformity with the BST method. Via the BST chain, given test data is then applied to the output terminals of the ICs and subsequently it is checked, again via the BST chain, whether the corresponding input terminals have received the expected data. In order to test an interconnection completely in this manner, all ends of the interconnection must be connected to BST cells. The interconnections of the pins (12) and (14) cannot be tested by way of the BST method because the resistors do not comprise BST logic, so that they must be tested during a separate step by means of separate means, for example, by means of a tester which connects a test probe to a specially provided test point.

Figure 2:
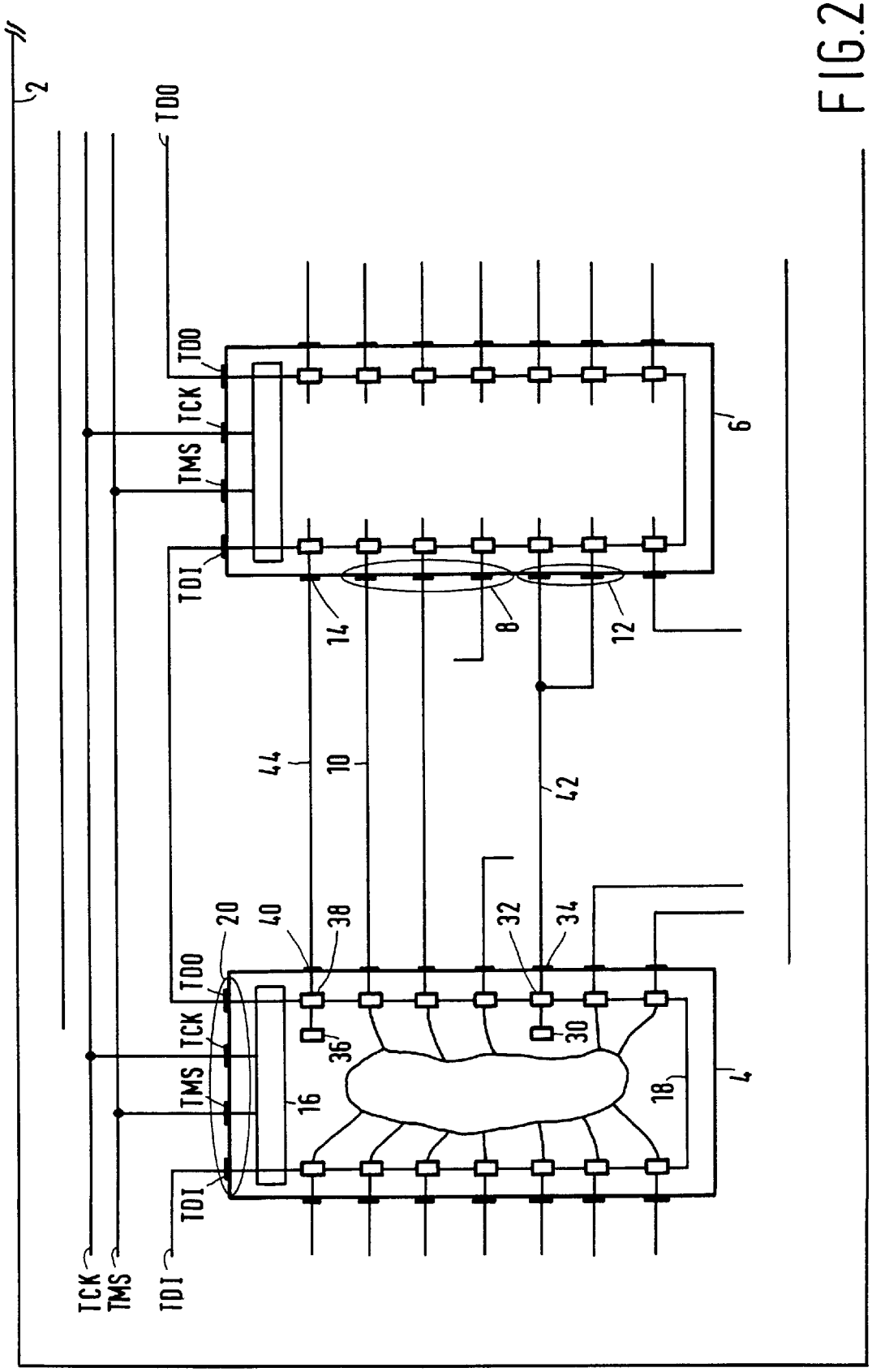
FIG. 2 shows an implementation of the invention in which an IC outputs the fixed logic values.

FIG. 2 shows the part of the support of FIG. 1 in which the invention is used. The input pins (12) and (14) now receive fixed logic values from the other IC (4). To this end, the IC (4) comprises a sub-circuit (30) which applies a logic "0" to the output pin (34) and a sub-circuit (36) which outputs a logic "1" via output pin (40). Between the sub-circuits and the output pins there are provided BST cells (32) and (38) whereby test patterns are applied to the connections, via the output pins, during testing. The pins (12) are connected to the output pin (34) via an interconnection (42) and the pin (14) is connected to output pin (40) via an interconnection (44). The interconnections (42) and (44) can now be completely tested in conformity with the BST method. The interconnections are now tested as a part of the testing procedure for the other interconnections and, moreover, separate test means are no longer required for this purpose.

During the execution of a test in conformity with the BST method, predetermined signals are applied to the test connection (20) in order to set the IC (4) to the test mode. Furthermore, test data applied to the connection (20) is transferred, possibly after an intermediate operation, to the relevant output pins, via the chain of BST cells, and hence to the interconnections whereto these pins are connected.

In addition to the advantage that the interconnections to inputs carrying a fixed logic value are tested in a superior manner, the invention also offers other advantages. Components are saved in that resistors are no longer required to provide the relevant inputs with a fixed value. An implementation of the invention may be such that one output pin supplies several inputs with the relevant logic value. An example in this respect is formed by the connection of two input pins (12) to one output pin (34). Another advantage of the invention resides in the fact that test points are no longer required on the conductor pattern implementing the interconnection to the inputs. This offers, inter alia, a greater freedom in designing this pattern.

The field of application of the invention, as described by way of example with reference to FIG. 2, is not restricted to a given logic or implementation thereof. Examples of applications are: bivalent logic, trivalent logic, TTL implementations and ECL implementations.

Furthermore, it may be that the IC comprising the means itself comprises an input requiring a fixed logic value for a given application. For this application the IC may supply its own input with the relevant value and, moreover, it can also test the required connection. The ICs (4) and (6) of FIG. 2 are then coincident and also one test connection is involved in that case.

Figure 3:
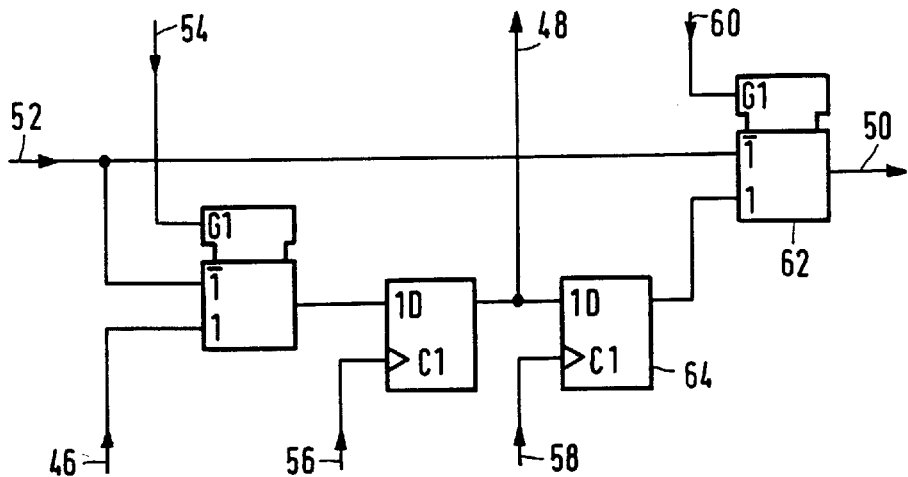
FIG. 3 shows an implementation of the BST cell for an output of the IC supplying the fixed logic values.

FIG. 3 shows a feasible implementation of a BST cell. A brief description of the behaviour of the BST cell will be given hereinafter. For a complete specification of the cell reference is made to the BST standard (IEEE Std. 1149.1-1990). The BST cell forms part of a chain, for which purpose it is connected to a preceding BST cell via (46) and to a subsequent BST cell via (48). The BST cell also comprises an output (50) which is connected, in the present case, to the output pin of the IC, and an input (52) which receives the data from the core logic of the IC. For use in conformity with the invention, the input (52) will not receive functional data in a conventional sense, but a fixed logic value: a "0" for the implementation for the pin (34) and a "1" for implementation for the pin (40). Furthermore, the BST cell comprises connections (54), (56) and (58) for shifting test data to the correct position in the BST chain and a connection (60) which determines the behaviour of the BST cell. When the connection (60) has the value "1", the cell is in the test mode and, via a multiplexer (62), the test data from the flipflop (64) will become available on the output (50). When the connection (60) has the value "0", the cell is in the functional mode and the data of the input (52) will be applied to the output (50) via the multiplexer (62).

Figure 4:
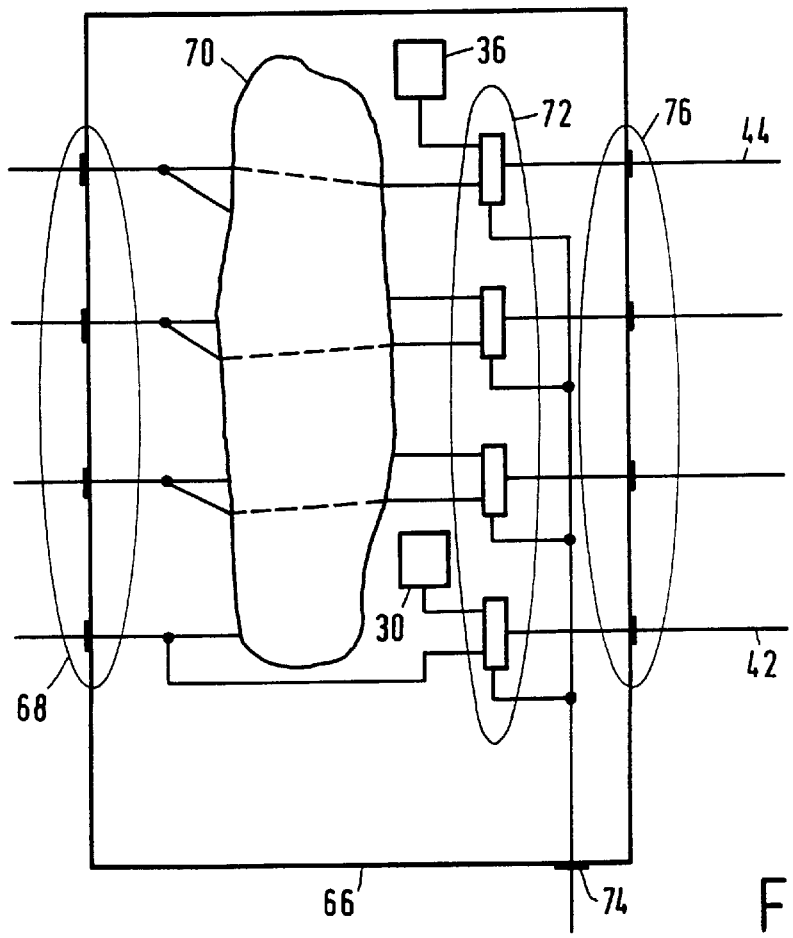
FIG. 4 shows an IC with multiplexers for applying test data to the outputs.

The interconnections (42) and (44) have a transmitting side, being the means supplying a fixed logic value, and a receiving side which is the input receiving the value. The means can be conceived as part of an IC, as shown in FIG. 2, or as a circuit consisting of discrete components. During the testing of the interconnections (42) and (44) the transmitting side applies test data to the interconnection and the receiving side reads result data. In addition to the described BST method there are various alternatives for realising such transmission and reception of test data. FIG. 4 shows an alternative for a transmitter and FIG. 6 shows an alternative for a receiver.

Figure 5:
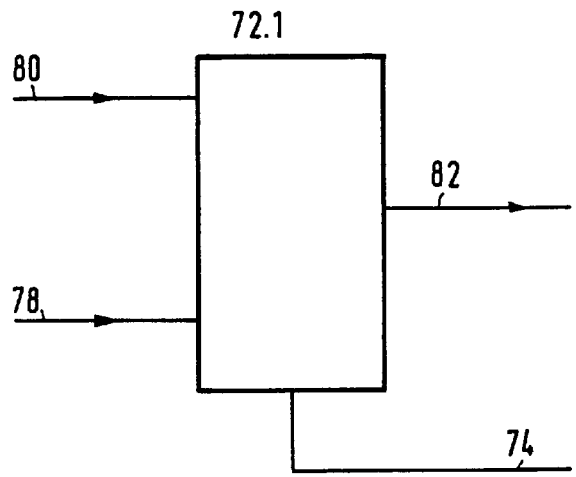
FIG. 5 is a detailed representation of a multiplexer of the IC.

FIG. 4 shows an IC (66) in which the input signals (68) are presented to the core logic (70) as well as to test inputs of the respective multiplexers (72). The control signal (74) determines whether the multiplexers apply the values on the test inputs or the values on the other, functional inputs to the outputs (76). FIG. 5 is a detailed representation of a multiplexer. The control signal (74) selectively determines that either the test signal (78) or the functional signal (80) appears as the output signal (82) of the multiplexer. Thus, via the control signal (74) data can be applied directly from inputs (68) to outputs (76). The test data is thus applied to the interconnections (42) and (44). When used in the circuit shown in FIGS. 1 and 2, the interconnection (42) receives a logic "0" from the means (30) during normal operation and the interconnection (44) receives a logic "1" from the means (36) during normal operation.

Figure 6:
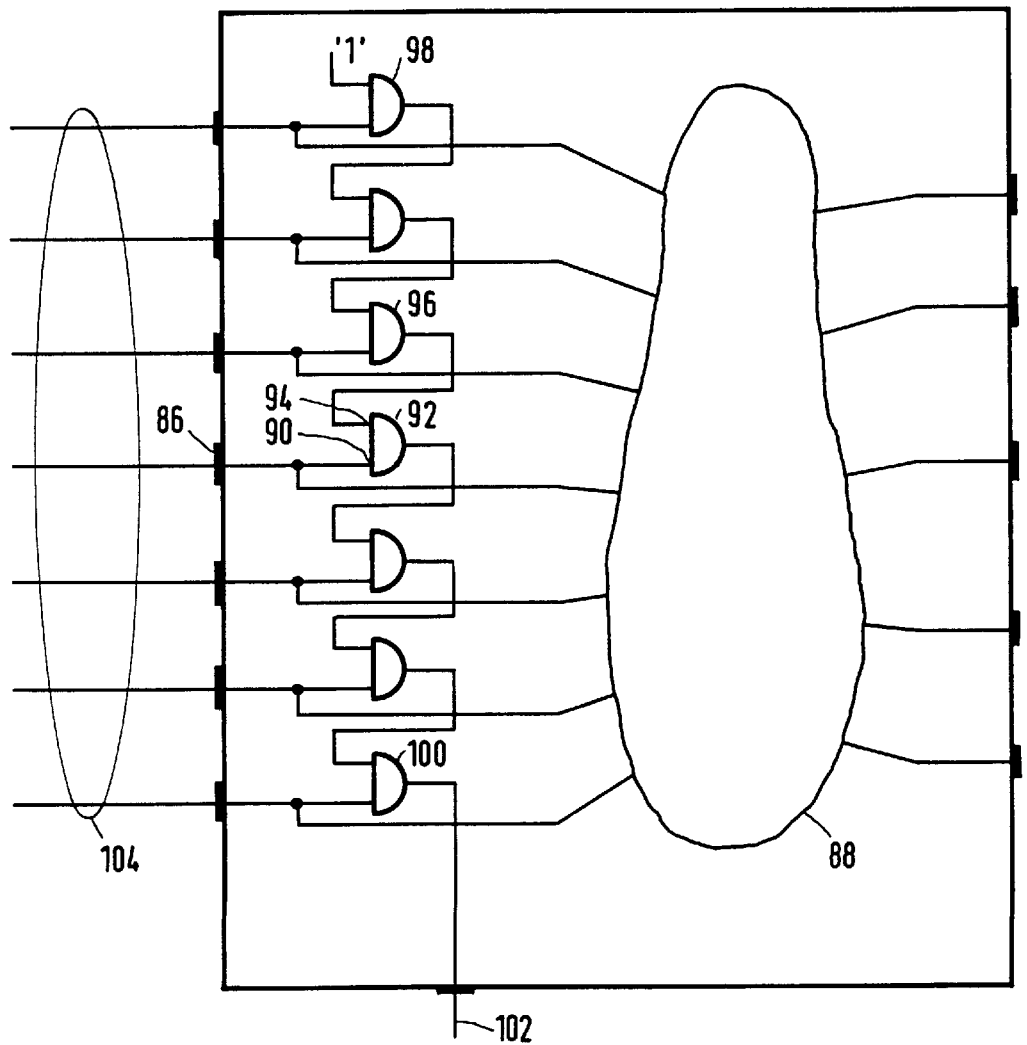
FIG. 6 shows an IC with logic AND-gates for observing data on the inputs.

FIG. 6 shows an IC which comprises, connected to the inputs, a tree of logic AND-gates (AND-tree). An input, for example, input (86), is connected to the core logic (88) as well as to an input (90) of an AND-gate (92). The other input (94) of the AND-gate is connected to the output of the preceding AND-gate (96) in the tree. The first AND-gate (98) carries a logic "1" on one input. The output of the last AND-gate (100) carries the result of the preceding AND-operations on all connected inputs and is output via the connection (102). If all connected inputs receive a logic "1", a logic "1" will be present on the output (102). If at least one of the inputs receives a logic "0", a logic "0" will be present on the output. The condition of the interconnections can be determined by applying test patterns to the interconnections (104) and by reading each time the output (102). An example in this respect is the presentation of a logic "0", whereas the others receive a "1", in order to check whether the relevant interconnection is conductive.

The foregoing description concerned a device with an integrated circuit and a means for supplying an input of the integrated circuit with a fixed logic value. A conventional implementation of the means involves the use of pull-up and pull-down resistors, but the testing of the relevant interconnections then requires an additional step and additional means. The invention offers an improvement by realising the means so that during testing the output which supplies the logic value during normal operation is controlled via test logic. As a result, the interconnections are thus tested by means of such means in the same way and as a part of the testing of the other interconnections.

What is claimed is:

1. A device comprising: an electronic circuit with a first test connection, a means having an output for supplying a signal input of the electronic circuit with a fixed logic value signal in an operational mode of the device, and an electric interconnection between the output of said fixed logic value signal supplying means and the signal input of the electronic circuit, wherein the means comprises a second test connection and the electronic circuit and the means are arranged to enter a test mode, under the control of predetermined signals on the respective test connections, in order to test the electric interconnection in a test cycle comprising: (1) setting the means and the electronic circuit to the test mode, (2) supplying the second test connection with and transferring, via said output, test data to the electric interconnection as an alternative to the fixed logic value signal, and (3) receiving result data in the electronic circuit via the signal input, and transferring result data to the first test connection for verification.

2. A device as claimed in claim 1, wherein for the testing of the interconnection, at least the means or the circuit is arranged to execute a test in conformity with the Boundary Scan Test method.

3. A means for use in a device as claimed in claim 1.

4. A means for use in a device as claimed in claim 1, comprising: a second output for supplying a second fixed logic value signal in an operational mode, which second fixed logic value signal deviates from the first fixed logic value signal, wherein the means is arranged to enter a test mode, under the control of predetermined signals on the second test connection, in order to test an interconnection which is connected to the second output, in a cycle comprising: (1) setting the means and the electronic circuit to a test mode, (2) supplying the second test connection with and transferring, via the second output, test data to the interconnection as an alternative to the second fixed logic value signal, and (3) receiving result data in the electronic circuit via the signal input and transferring result data to the first test connection for verification.

5. A means as claimed in claim 3, implemented on a semiconductor substrate.

6. A means as claimed in claim 5, wherein the semiconductor substrate also accommodates a circuit providing another electronic function.

7. A method of testing an interconnection between an output of a means which, in an operational mode supplies a fixed logic value, and a signal input of an electronic circuit, the method comprising: (1) setting the means and the electronics circuit to a test mode through predetermined signals, (2) supplying test data to a first test connection of the means and transferring, via the output of the means, test data to the interconnection as an alternative to the fixed logic value, and (3) receiving result data in the electronic circuit via the signal input and transferring the result data to a second test connection of the electronic circuit for verification.

8. A method as claimed in claim 7, wherein the testing is carried out in conformity with the Boundary a Scan Test method.

9. A means for use in a device as claimed in claim 2.

10. A means as claimed in claim 9, comprising: a second output for supplying a second fixed logic value signal in an operational mode, which second fixed logic value signal deviates from the first fixed logic value signal, wherein the means is arranged to enter a test mode, under the control of predetermined signals on the second test connection, in order to test an interconnection which is connected to the second output, in a cycle comprising: (1) setting the means and the electronic circuit to a test mode, (2) supplying the second test connection with and transferring, via the second output, test data to the interconnection as an alternative to the second fixed logic value signal, and (3) receiving result data in the electronic circuit via the signal input and transferring result data to the first test connection for verification.

11. A means as claimed in claim 4, implemented on a semiconductor substrate.

12. A means as claimed in claim 10, implemented on a semiconductor substrate.

13. A means as claimed in claim 11, wherein the semiconductor substrate also accommodates a circuit providing another electronic function.

14. A means as claimed in claim 12, wherein the semiconductor substrate also accommodates a circuit providing another electronic function.

15. A device for testing the electric interconnections of first and second integrated circuits comprising:

a support member which supports said first and second integrated circuits and electric interconnections which couple given terminals of the first integrated circuit to given terminals of the second integrated circuit, wherein the first integrated circuit includes a first test connection and means for supplying a fixed logic value signal to a first input terminal of the second integrated circuit via a first electric interconnection between a first output terminal of the first integrated circuit and the first input terminal of the second integrated circuit in an operational mode of the first and second integrated circuits, wherein the second integrated circuit includes a second test connection, and means for controlling said first and second integrated circuits, via said first and second test connections, into a test mode in order to test said electric interconnections including the first electric interconnection, said controlling means generating signals to produce a test cycle comprising; (1) setting the first and second integrated circuits into the test mode, (2) supplying the first test connection with test data signals and transferring the test data signals from the first integrated circuit to the second integrated circuit via said electric interconnections and via said first electric interconnection instead of the fixed logic value signal, and (3) transferring test result data signals received by the second integrated circuit via the electric interconnections to the second test connection for verification of the integrity of the electric interconnections.

16. A device as claimed in claim 15 wherein the first and second integrated circuits each comprise a series chain of Boundary Scan Test (BST) cells coupled to the given terminals of the respective integrated circuits and controlled by said controlling means and the respective first and second test connections so as to test the electric interconnections in conformity with the Boundary Scan Test method.

17. A device as claimed in claim 16 wherein the Boundary Scan Test cell in the first integrated circuit, which cell is coupled to the first output terminal of the first integrated circuit, comprises a multiplexer having a first input coupled to receive the fixed logic value signal, a second input coupled to receive a test data signal, and a control input controlled by said controlling means for selectively passing the signal at one of the multiplexer first and second inputs to said first output terminal of the first integrated circuit.

\* \* \* \* \*